US005086227A

United States Patent [19]

Toita et al.

[11] Patent Number: 5,086,227

[45] Date of Patent: Feb. 4, 1992

[54] SECONDARY ION MASS ANALYZING APPARATUS

[75] Inventors: Hiroshi Toita; Hiroshi Hirose, both of Katsuta; Hifumi Tamura, Hachioji, all of Japan

[73] Assignees: Hitachi, Ltd., Chiyoda; Hitchhi Instrument Eng. Co., Ltd., Ibaraki, both of Japan

[21] Appl. No.: 599,407

[22] Filed: Oct. 18, 1990

[30] Foreign Application Priority Data

Oct. 23, 1989 [JP] Japan .................................. 1-273802

[51] Int. Cl.$^5$ ..................... G01N 23/225; H01J 37/256

[52] U.S. Cl. .................................... 250/309; 250/299; 250/397

[58] Field of Search ........................ 250/309, 299, 397

[56] References Cited

U.S. PATENT DOCUMENTS 5,008,537 4/1991 Toita et al. .......................... 250/309

FOREIGN PATENT DOCUMENTS 53-14953 5/1978 Japan .

OTHER PUBLICATIONS

Tamura et al., Proc. 6th Chateunl, Vacuum Congr, 1974, pp. 379-382.

*Primary Examiner*—Jack I. Berman

*Attorney, Agent, or Firm*—Antonelli, Terry, Stout & Kraus

[57] ABSTRACT

A secondary ion mass analyzing apparatus is suitable for a depth directional analysis of a specimen. The apparatus includes means for forming an image of said secondary ions, an aperture disposed on a position in which the secondary ion image is formed, means for detecting the secondary ions which have passed through the aperture and for converting the detected ions into electrical signals, and means for displaying an image of said aperture based on the electrical signals. In such a manner, the aperture is disposed on the secondary ion image forming position. The image of the aperture is displayed on the image displaying apparatus by using the secondary ions which have passed through the aperture. If the ion image is not formed on the position of the aperture, the contour of the aperture image would be unclear while if the ion image is formed on the position of the aperture, the contour of the aperture image would be clear. Accordingly, by monitoring the clearness of the aperture image, focusing of the ion image upon the aperture position may be determined. Therefore, the secondary ions which have generated from the specimen corresponding to a portion other than the central portion of the primary ion beam can be prevented from being introduced to a mass analyzing portion. A depth directional analysis of the specimen can be accomplished at a high accuracy.

9 Claims, 5 Drawing Sheets

SECONDARY ION MASS ANALYZING APPARATUS

BACKGROUND OF THE INVENTION

The present invention relates to a secondary ion mass analyzing apparatus and in particular to a secondary ion mass analyzing apparatus which is suitable for performing a depth directional analysis of a specimen at a high accuracy.

Prior art secondary ion mass analyzing apparatuses have been widely used for depth directional analysis of a specimen. Electronic aperture method has been widely used for enhancing the accuracy of the analysis in a depth direction. The electronic aperture method includes raster-scanning a primary ion beam on a specimen to etch the specimen uniformly, gating a detection system so that secondary ion from etching crater edges different in depth will not be introduced to a mass analyzer, introducing signals from only the central portion of the etched crater to the mass analyzer to integrate them, whereby the accuracy of the depth directional analysis, that is, the dynamic range in a depth direction is enhanced.

In accordance with this electronic aperture method, the specimen is subjected to two dimensional scanning of a primary ion beam along X and Y axes. This causes the specimen to be etched so that the etched portion becomes a crater. Secondary ions are generated from the crater and are detected.

Among the detected secondary ions, the secondary ions from the edge of the crater are eliminated by an electrical gate, that is, an electronic aperture so that substantially only the ions from the central portion of the crater, that is, only the necessary secondary ion beam is introduced to the mass-analyzer in which it is mass-analyzed. This enhances the analysis accuracy of the specimen in a depth direction and widens the dynamic range.

It is known that the ion density distribution of primary ion beam generally exhibits a Gaussian distribution characteristics. However, the density distribution of primary ions in fact exhibit a distribution having a skirt remarkably broader than that of the Gaussian distribution due to variations in initial energy of the primary ions and collision with residual gas molecules and scattering thereby. Therefore, introduction of the secondary ions generated from the periphery of the crater into the mass analyzer is inevitable even if the electronic sperture is opened only when the primary ion beam is positioned in the center of the crater.

FIG. 1 is a view showing the above mentioned prior art electronic aperture method.

In FIG. 1, a crater 3 is formed on a specimen 2 by etching if a primary ion beam 1 is raster-scanned on the specimen 2.

It is known that the ion density distribution 4 of primary ion beam 1 generally exhibits a Gaussian distribution characteristics. However, practical density distribution of primary ions exhibits a distribution having a skirt remarkably broader than that of the Gaussian distribution due to variations in the initial energy of the primary ions and collision with residual gas molecules and scattering thereby. Although a detection gate is opened in the electronic aperture method when the center of the primary ion beam 1 is located at a secondary ion capture area 5, the captured secondary ions inevitably include unwanted secondary ions from the periphery of the crater edge 6 due to existence of the skirt of the density distribution of the primary ion beam 1.

FIG. 2 is a view showing an imaging condition of a secondary ion emission pattern in a prior art method.

In order to overcome the above mentioned problems, there is an approach in which an emission pattern of the secondary ions 7 emitted by irradiation with the primary ions 1 is imaged on a position of an entrance slit 9 of a mass analyzer by means of an extraction electrode 10 and a transfer lens 8 so that the field of the emission pattern is restricted by the dimension of the entrance slit and only such ions as do not include any ions from the crater periphery parts are introduced to the mass analyzer by restricting the dimension of the beam and the secondary ions from the periphery of the beam distribution. However in this approach, it is an essential requirement that the emission pattern of the secondary ions 7 emitted from the specimens 2 be exactly imaged on the position of the entrance slit 9 by means of the transfer lens. An approach including forming an image of a specimen 2 of secondary ions 7 generated from the specimen 2 on a predetermined position by a lens, providing an aperture at this position and taking only secondary ions from a specimen area corresponding to the central portion of the primary ion beam 1 by this aperture for preventing the introduction of the secondary ions 7 generated from the periphery of the crater 3 into a mass analyzer is known from Japanese Patent Publication 53-14935. This approach will be referred to as unnecessary secondary ion removing technique using lens and aperture.

However, in the above mentioned prior art approach a secondary ion 7 emission pattern is imaged on the entrance slit 9. Means for setting and confirming detailed conditions for imaging an emission pattern on the entrance slit 9 is not considered. There is a problem that effects by a structure cannot be exhibited.

In other words, setting of conditions of the lens 8 can be determined based on only the strength of the secondary ions 7 passing through the entrance slit 9. The conditions of the lens 8 are preset in such a manner that a maximum amount of the secondary ions 7 can pass through the entrance slit 9.

However, means for confirming whether or not an image of the specimen is formed at the position of the aperture is not considered. It is determined that ions collide with nothing and the ion orbit is correct if the amount of ions is more than a reference value. There is a problem that inherent effects of unnecessary secondary ion elimination technique using lens and aperture may not be sufficiently obtained.

SUMMARY OF THE INVENTION

It is a primary object of the present invention to provide a secondary ion mass analyzing apparatus which is suitable for eliminating secondary ions generated from a specimen portion corresponding to a portion other than central portion of a primary ion beam, that is, from the periphery of a crater.

It is another object of the present invention to provide a secondary ion mass analyzing apparatus in which it may be determined whether a specimen image of secondary ions generated from a specimen is formed or not on an aperture, and as a result, secondary ions generated from a specimen portion corresponding to a portion other than the central portion of a primary ion beams, that is from the periphery of the crater may be prevented from being introduced to a mass analyzing portion.

It is a further object of the present invention to provide a secondary ion mass analyzing apparatus which makes it possible to conduct exact setting of conditions for imaging a secondary ion emission pattern on an entrance slit.

In order to accomplish the above mentioned objects, there are provided means for forming an image of secondary ions, an aperture disposed on a position in which the image is formed, means for detecting the secondary ions which have passed through the aperture and for converting the detected ions into electrical signals, and means for displaying an image of said aperture based on the electrical signals.

In accordance with the present invention, an aperture is disposed upon a secondary ion image forming position. The image of the aperture is displayed on an image displaying apparatus by using the secondary ions which have passed through the aperture. If the ion image is not formed on the position of the aperture, the contour of the aperture image would be unclear while if the ion image is formed on the position of the aperture, the contour of the aperture image would be clear. Accordingly, by monitoring the clearness of the aperture image, focusing of the ion image upon the aperture position may be determined. Therefore, the secondary ions which have been generated from the specimen corresponding to a portion other than the central portion of the primary ion beam can be prevented from being introduced to a mass analyzing portion.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

Figure 1:
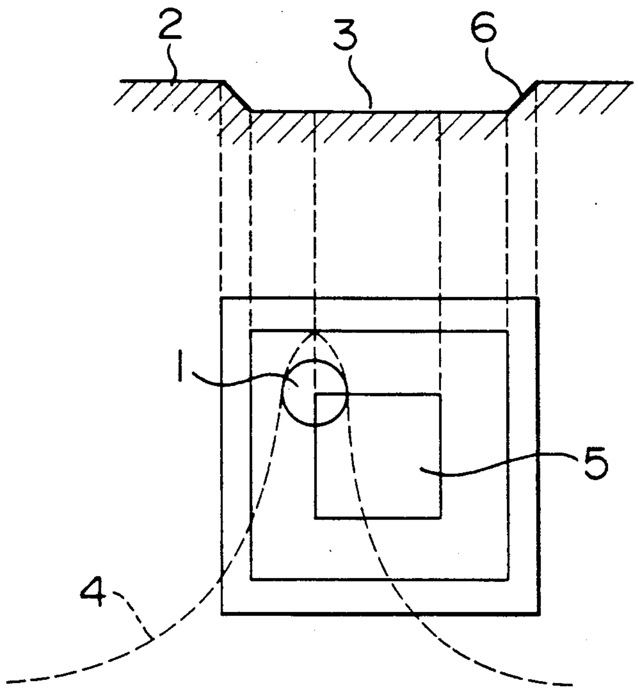
FIG. 1 PRIOR ART
FIG. 1 is a view showing a prior art electronic aperture method.
Figure 2:
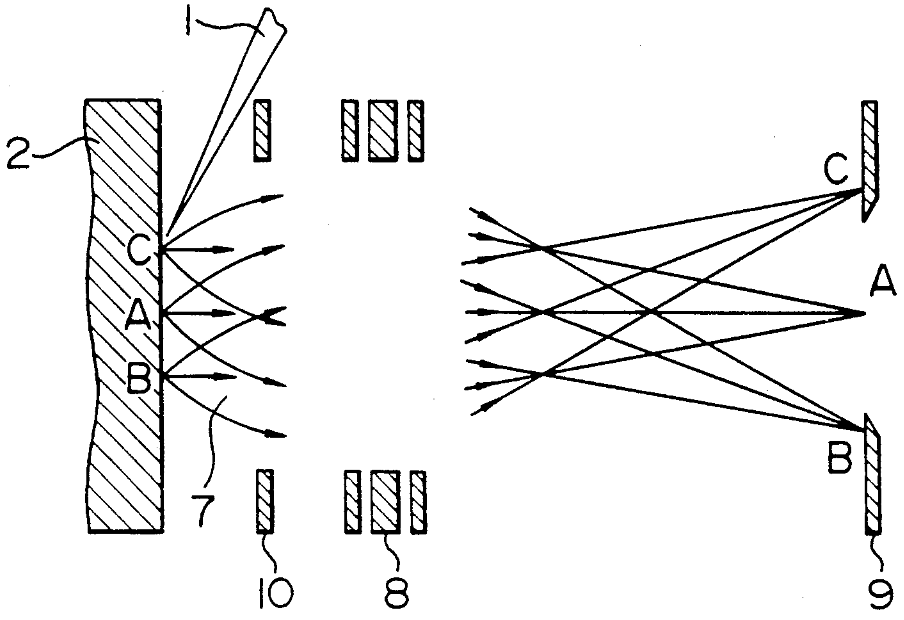
FIG. 2 PRIOR ART
FIG. 2 is a view showing an imaging condition of an emission pattern of secondary ions in a prior art.
Figure 3:
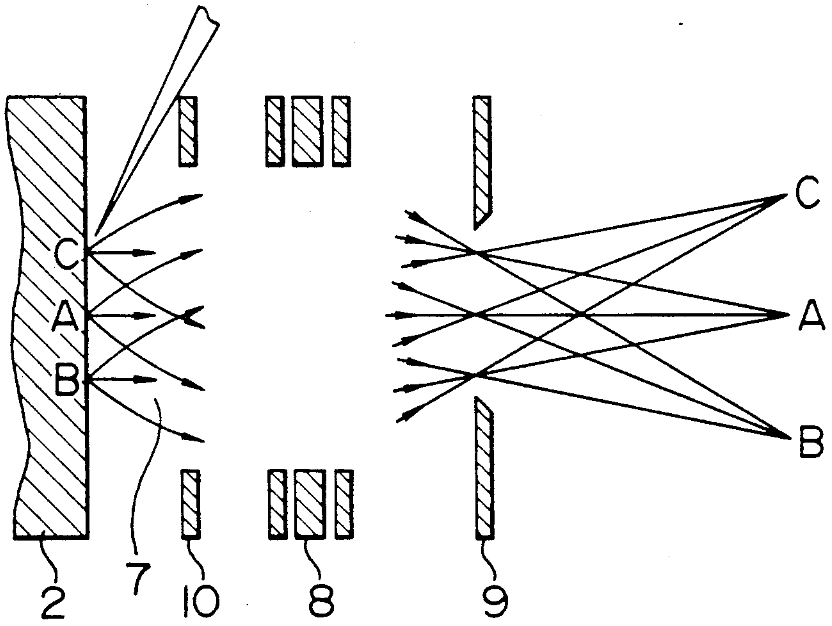
FIG. 3 PRIOR ART
FIG. 3 is a view for explaining setting of lens conditions in a prior art.
Figure 4:
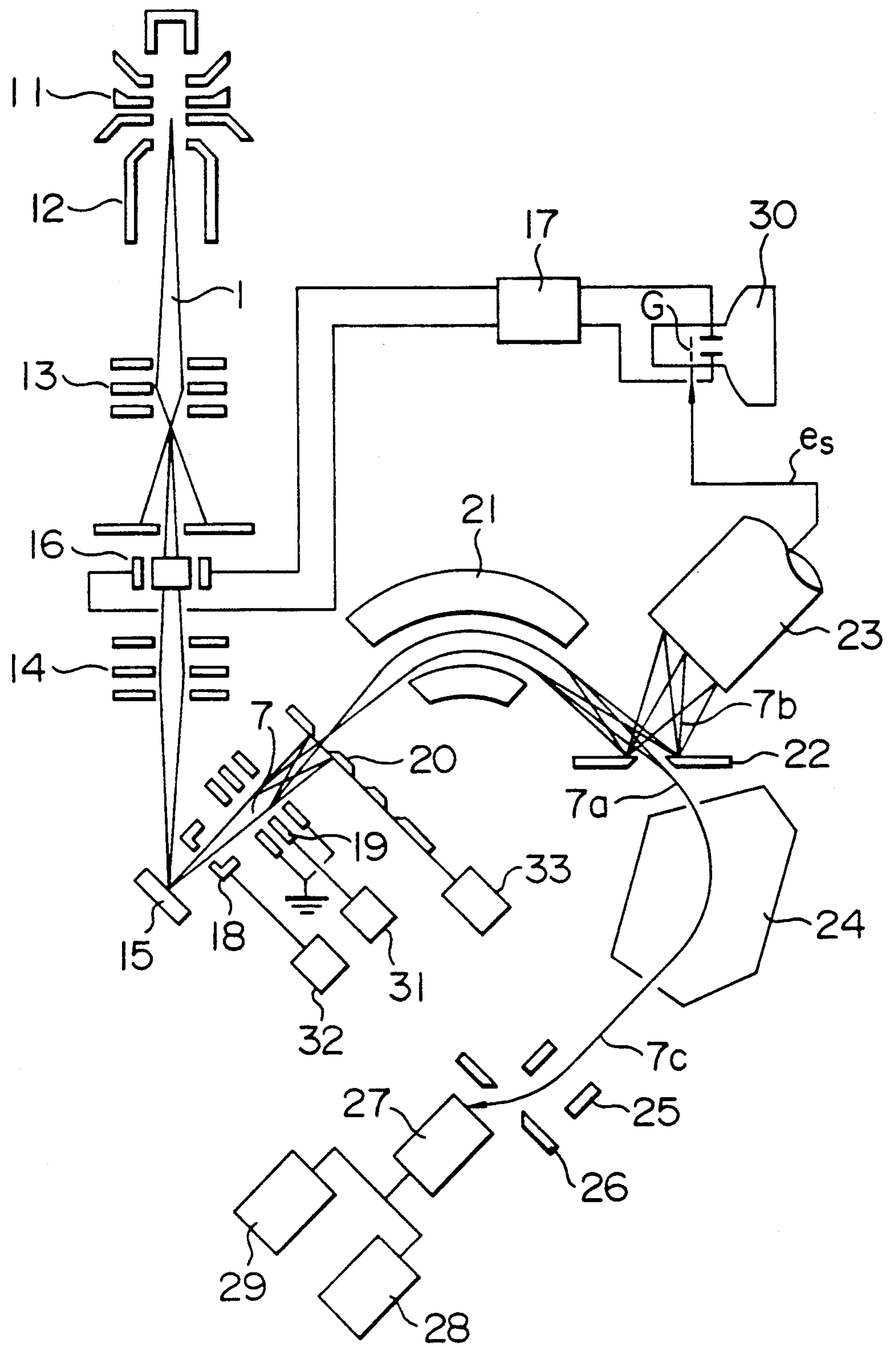
FIG. 4 is a structural view showing a first embodiment of a secondary ion mass analyzing apparatus of the present invention.

Referring now to FIG. 4, there is shown a first embodiment of the present invention. In FIG. 4, a primary ion beam 1 which is emitted from an ion source 11 is pulled out by means of a pull-out electrode 12 and is converged upon a specimen 15 by means of lenses 13 and 14.

A deflecting voltage which is a deflection signal is applied upon a static field type apparatus 16 from a deflection power source 17. This causes the converged primary ion beam 1 to be two dimensionally scanned on and along the specimen 15.

When the specimen 15 is bombarded with the converged primary ion beam 1 and is subjected to two dimensional scanning of the primary ion beam 1, the specimen 15 is etched with the primary ion beams 1 so that the etched portion becomes a crater.

Secondary ions 7 which are generated from the specimen 15 are pulled out by a pull-out electrode 18 so that an image of the specimen 15 is formed of the secondary ions 7 on the position of an entrance slit or an aperture 20 by means of a static field type lens 19.

The primary ion beam 1 generally exhibits a distribution having a skirt remarkably broader than that of the Gaussian distribution as mentioned above. Accordingly, the secondary ions 7 generated from the center the crater may include the secondary ions 7 generated from the crater edge even if the primary ion beams bombards the center of the crater of the specimen 15. However the secondary ions 7 emitted from the specimen 15 portion corresponding to a portions other than the center of the primary ion beam 1 are eliminated by the aperture 20. The secondary ions from the crater edge are thus eliminated by the aperture 20 while only the secondary ions 7 from the center of the crater substantially pass through the aperture 20.

The secondary ions **7*b* which has passed through the aperture 20 are dispersed depending on its energy by an electrostatic field generated from an electrostatic field generator 21. An ion electron converter 22 is disposed on an energy focusing plane at which an energy is converged with a static field. The secondary ions (non mass-dispersed ions) 7*a* having a given energy pass through an opening of the ion electron converter 22 while the secondary ions (non mass-dispersed ions) 7*b* having the other energy are converted into electrons by the ion electron converter 22. The converted electrons are detected by a secondary ion detector 23 which generates electrical signals $e_s$ corresponding to the amount of the secondary ions detected by the ion electron converter 22**.

The secondary ions **7*a* which have passed through the ion electron converter 22 are dispersed depending on its mass by a magnetic field generated by a magnetic field generator 24. The secondary ions 7*c* having a given mass number are deflected by a deflector 25 and pass through a collector-slit 26 and a specific ion detector 27. The output signals from the specific ion detector 27 are recorded by a recorder 28 and are inputted to a data processor 29**.

Although illustration is omitted, the magnetic field generated by the magnetic field generator 24 is swept to perform a mass number sweeping. That is, the secondary ions having various mass numbers are successively detected by the specific ion detector 27 by the magnetic field sweeping.

Among the secondary ion mass analyzers of the present invention, a double focusing secondary ion mass analyzer which converges both the energy and the direction at the same time has been described herein.

On the other hand, electrical signals $e_s$ from the detector 23 are applied to a grid G which is a brightness modulation electrode of a cathode ray tube 30. Deflection signals from a deflection power source 17 are also applied to a deflection apparatus of the cathode ray tube 30. This accomplishes two demensional scanning on a screen of the cathode ray tube 30 in synchronization with two dimensional scanning on the specimen 15. Accordingly, the image of a scanned area of the specimen 15 which is restricted by the aperture 20 is displayed on the screen of the cathode ray tube 30.

Concerning to the image of the aperture 20 displayed on the cathode ray tube 30, the contour of the aperture image would be clear if the secondary ion image of the specimen 15 is formed just on the position of the aperture 20 and would be unclear if it is not formed on the position of the aperture. In the latter case, a lens power source 31 connected with the static lens 19 is adjusted to change the focal length of the lens 19 by automatically or manually changing the voltage of the lens power source 31 until the contour of the aperture image displayed on the cathode ray tube 30 becomes clear. As a result of this, the secondary ion image of the specimen 15 is formed on the aperture 20. It is of course that the imaging position of the secondary ion image may optionally be changed by adjusting the voltage applied to the pull-out electrode 18 from the power source 32 solely or together with the adjustment of the lens 19.

Figure 5:
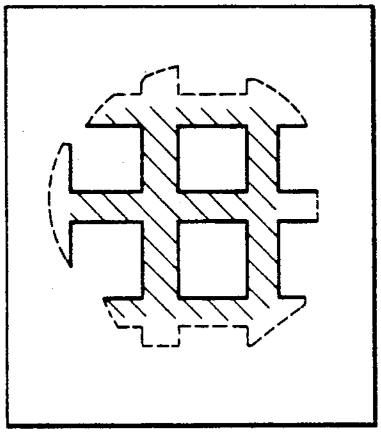
FIGS. 5 through 7 are views showing images displayed on a cathode ray tube shown in FIG. 4.
Figure 6:
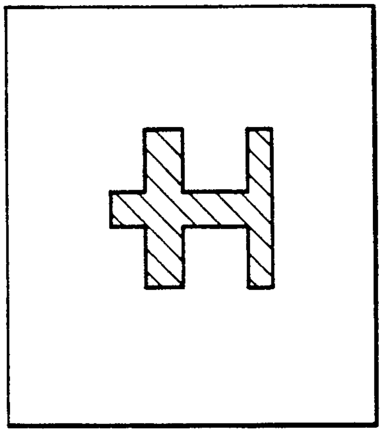

FIGS. 5 and 6 show images displayed on the cathode ray tube 30 when a metallic mesh is used as a specimen 15 in FIG. 4.

FIG. 5 shows a secondary ion image of the metallic mesh of the specimen 15 which is not formed on the aperture 20. It is found from FIG. 5 that the area of the displayed image is larger and that a boundary between a mesh image appearing area and an area at which a mesh image reflecting the shape of the aperture 20 does not appear is not clear. In contrast to this, FIG. 6 shows a secondary ion image of the metallic mesh of the specimen 15 which is just formed on the aperture. It is found from FIG. 6 that a boundary between a mesh image appearing area and an area at which a mesh image reflecting the shape of the aperture 20 does not appear is clear and that the image is restricted by the aperture 20 so that only the secondary ions 7 corresponding to the center of the primary ion beam 1 are subjected to mass analysis.

In order that the secondary ion image be located in the center of the cathode ray tube 30, fine adjustment of the vertical position of the specimen 15 and the lateral position of the aperture 20 is carried out. The secondary ion image may be displayed on the cathode ray tube 30 during a depth direction analysis. Accordingly, shift of the ion orbit due to charge up of the specimen 15, etc. can be detected by monitoring the shift of the secondary ion image from the center of the cathode ray tube 30.

On the other hand, the aperture 20 may be replaced with other aperture having a desired opening shape such as circle, T-shape and L-shape and a desired dimension. This may be accomplished by moving each opening to the secondary ions passing path by means of an aperture driving apparatus 33 connected with the aperture 20.

Figure 7:
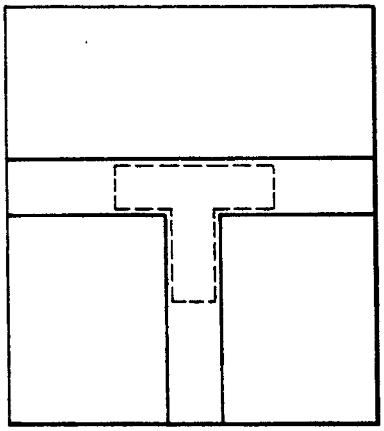
Figure 9:
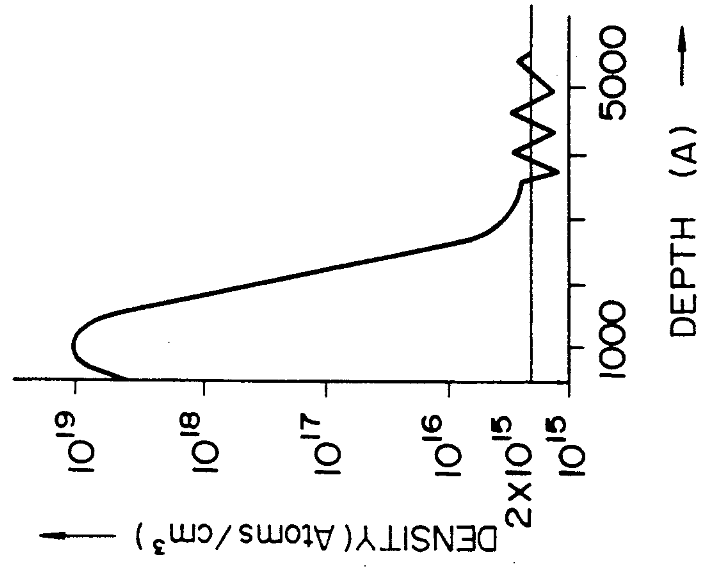
FIG. 9 is a view showing an example of analysis data on a specimen in a depth direction in accordance with the present invention.

In an example shown in FIG. 7, a large area of a patterned region to be analyzed is assured by use of an aperture having a T-shaped opening represented with a dotted line so that the ions from the other areas cannot be captured, resulting in an enhancement in detection sensitivity.

Figure 8:
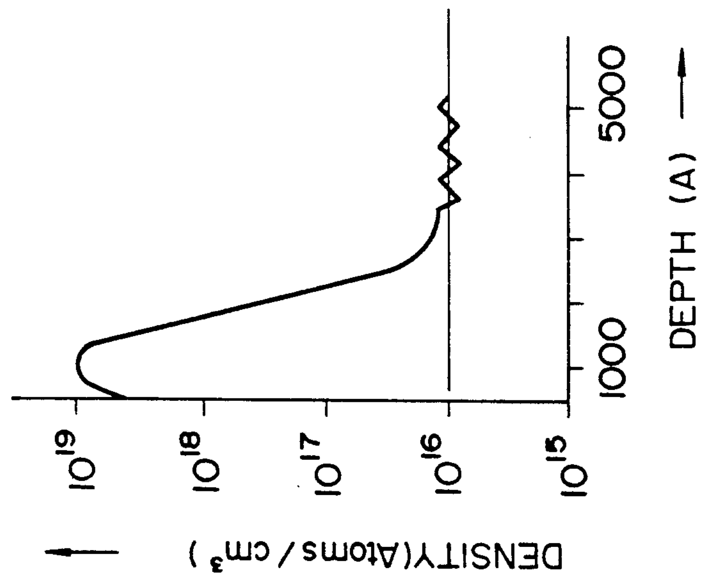
FIG. 8 PRIOR ART
FIG. 8 is a view showing an example of analysis data on a specimen in a depth direction based on a prior art.

Effects of the embodiments of the present invention will be listed as follows:

(1) The secondary ions 7 from a specimen portion corresponding to a portion other than the center of a primary ion beam 1 may be eliminated so that they are not introduced to a mass analyzing portion (2) Setting of conditions for forming a secondary ion 7 image of a specimen on an aperture 20 may be appropriately conducted by observing the image of the aperture 20. This makes it possible to lead only secondary ions which have inherently genuine excluding ions from crater periphery for increasing accuracy of the depth directional analysis. An effect in case of analysis of phosphorus in silicon will be mentioned. A detection limit of a prior art was $1\times10^{16}$ Atoms/cm$^3$ as shown in FIG. 7, while it is $2\times10^{15}$ Atoms/cm$^3$ as shown in FIG. 8 in accordance with the present invention which is about one digit enhancement.

(3) The aperture 20 may be replaced with the other aperture having various shapes and dimensions. A wide area may be analyzed by selecting an opening adapted to the surface configuration of a specimen such as a pattern of a semiconductor device for enhancing the sensitivity.

What is claimed is:

1. A secondary ion mass analyzing apparatus in which a primary ion beam is scanned on a specimen to perform a mass analysis of secondary ions emitted from the specimen, comprising:
- means for forming an image with said secondary ions;
- an aperture disposed on a position in which the secondary ion image is formed;
- secondary ion converting means for detecting the secondary ions which have passed through the aperture and for converting the detected ions into electrical signals; and
- means for displaying an image of said aperture based on said electrical signals.

2. A secondary ion mass analyzing apparatus in which a primary ion beam is scanned on a specimen to perform a mass analysis of secondary ions emitted from the specimen, comprising:
- means for forming a secondary ion image of the specimen at a predetermined position;
- an aperture disposed at said predetermined position;
- means for detecting the secondary ions which have passed through the aperture and for converting the detected ions into electrical signals; and
- means for displaying an image of said opening based on said electrical signals.

3. A secondary ion mass analyzing apparatus including:
- means for generating a primary ion beam;
- means for converging the generated primary ion beam upon a specimen;
- means for generating secondary ions from the specimen by scanning the converged primary ion beam on said specimen;
- means for mass analyzing the secondary ions; and
- means for detecting the secondary ions which were mass analyzed,
- characterized in that said apparatus comprises;
- means for forming an image with said secondary ions at a predetermined position between said specimen and said mass analyzing means;
- an aperture disposed at said predetermined position;
- means for detecting said secondary ions which have passed through said aperture to convert the detected ions into electrical signals; and
- means for displaying an image of said aperture based upon said electrical signals,
- said secondary ion image forming means including means for adjusting the position of said secondary ion image.

4. A secondary ion mass analyzing apparatus as defined in claim 3 characterized in that said secondary ion image forming means includes:

an electrostatic field lens;

means for supplying said electrostatic field lens with a voltage; and means for changing said voltage.

5. A secondary ion mass analyzing apparatus as defined in claim 3 characterized in that said aperture has a plurality of openings which may be selectively disposed in a path of said secondary ions, said openings being different from each other in shapes or dimensions or both.

6. A secondary ion mass analyzing apparatus including:

means for generating a primary ion beams;

means for converging the generated primary ion beam upon a specimen;

means for scanning said converged primary ion beam on said specimen to emit secondary ions from said specimen;

means for energy-dispersing the generated secondary ions;

means for mass dispersing said energy-dispersed secondary ions; and means for detecting the mass-dispersed secondary ions;

characterized in that said apparatus comprises;

an aperture disposed between said specimen and said energy-dispersing means;

means disposed between said aperture and said specimen for forming a secondary ion image of said specimen on said aperture;

means disposed between said energy-dispersing means and said mass dispersing means for detecting said secondary ions which were energy-dispersed; and means for displaying an image of said aperture based on output signals from said detecting means.

7. A secondary ion mass analyzing apparatus as defined in claim 6, characterized in that said image forming means includes means for adjusting the position of an image of said specimen so that the image of said specimen is formed on said aperture.

8. A secondary ion mass analyzing apparatus as defined in claim 6, characterized in that said image forming means includes:

an electrostatic field lens;

means for supplying said electrostatic field lens with a voltage; and means for changing said voltage.

9. A secondary ion mass analyzing apparatus as defined in claim 6 characterized in that said aperture has a plurality of openings which may be selectively disposed in a path of said secondary ions, said openings being different from each other in either shape or dimensions or both.

* * * * *